United States Patent [19]

Nakano

[11] Patent Number: 4,515,425
[45] Date of Patent: May 7, 1985

[54] IC SOCKET WITH IC PACKAGE PRESSING MEANS

[75] Inventor: Hidetaka Nakano, Tokyo, Japan

[73] Assignee: Yamaichi Electric Mfg. Co., Ltd., Tokyo, Japan

[21] Appl. No.: 585,217

[22] Filed: Feb. 28, 1984

[30] Foreign Application Priority Data

Feb. 28, 1983 [JP] Japan ............................. 58-28836[U]

[51] Int. Cl.³ .............................................. H01R 9/09
[52] U.S. Cl. ............................ 339/75 MP; 339/17 CF
[58] Field of Search .......... 339/17 CF, 75 M, 75 MP, 339/176 M, 176 MP; 220/323, 333

[56] References Cited

U.S. PATENT DOCUMENTS 239,191  3/1881  Ransom ................................ 220/323
4,456,318  6/1984  Shibata et al. .................. 339/75 MP

FOREIGN PATENT DOCUMENTS 514105  9/1952  Belgium ............................... 220/333

58-40545  9/1983  Japan .

OTHER PUBLICATIONS

IBM Technical Disclosure Bulletin, vol. 13, No. 5, 10-1970, "Insertion/Extraction Test Socket", Bruder.

*Primary Examiner*—John McQuade
*Attorney, Agent, or Firm*—Wenderoth, Lind & Ponack

[57] ABSTRACT

An IC socket with IC package pressing means comprises a socket substrate, an IC package pressing plate having one end thereof pivotally link-connected to one end of the socket substrate, and an operative lever having one end thereof pivotally link-connected to the other end of the IC package pressing plate and provided with engaging claw pieces which collide against the other end of the socket substrate, lead the IC package pressing plate and the operative lever to their respective laid-down positions relative to the socket substrate and engage with the aforementioned other end of the socket substrate.

4 Claims, 8 Drawing Figures

IC SOCKET WITH IC PACKAGE PRESSING MEANS

BACKGROUND OF THE INVENTION

1. Field of the Invention

The present invention relates to an IC socket having means for pressing an IC package.

2. Description of the Prior Art

Generally, an IC socket for an IC package comprises a socket substrate, a pressing cover pivotally attached to one end of the socket substrate and a lock lever pivotally attached to the other end of the socket substrate, and fulfills its function by placing an IC package on the socket substrate, rotating the pressing cover toward the upper surface of the IC package to press the IC package toward the socket substrate, and allowing the lock lever to be engaged with the pressing cover to retain the IC package in position between the socket substrate and the pressing cover, with the result that the terminals of the IC package are brought into pressing contact with the contacts in the socket substrate. The IC socket of this type is disclosed in Japanese Utility Model Publication No. 58-40545, for example. This IC socket is provided on the opposite sides thereof with parts as means for pressing the IC package, i.e. the pressing cover and the lock lever, as described above. For this reason, when a number of IC sockets are arranged in two or more rows on a printed board, the adjacent socket parts interrupt the operation of opening or closing the pressing cover and the operation of engaging or disengaging the lock lever. Further, the operation of closing the pressing cover and engaging the lock lever or the operation of disengaging the lock lever and opening the pressing cover must be effected with two hands, and the former operation requires strong force enough for the pressing cover to be pressed against the resilient force of the contacts in the socket substrate and also requires the lock lever to undergo complete lock which can overcome the pushing-up force of the contacts and prevent the pressing cover from rising.

It has recently been desired to develop an IC socket which is adapted to be used in an efficiency test for IC packages. Since this efficiency test repeatedly requires alternate attachment and detachment of IC packages, an IC socket is required to have a construction such that means for pressing an IC package suitably fulfills its function and that engagment and disengagement of the IC package pressing means can be rapidly carried out lightly and conveniently.

SUMMARY OF THE INVENTION

The present invention has been accomplished in view of the state of affairs as described above. The main object of the present invention is to provide an IC socket with IC package pressing means, which makes it possible to engage and disengage an IC package relative to the IC socket by easy operation and to obtain reliable contact between the IC package and the IC socket with uniform pressing force.

To attain the object described above, according to the present invention, there is provided an IC socket with IC package pressing means, which comprises a socket substrate, an IC package pressing plate pivotally linked with one end of the socket substrate, and an operative lever pivotally linked with the opposite end of the pressing plate and provided near the pivots thereof with engaging claw pieces which collide against the other end of the socket substrate to prevent the pressing plate from rising, lead both the pressing plate and the operative lever to their respective laid-down positions relative to the socket substrate and engage with the other end of the socket substrate.

The aforementioned object and other objects, features and advantages of the present invention will become apparent from the following description given in detail with reference to the accompanying drawings.

DESCRIPTION OF THE PREFERRED EMBODIMENT

Figure 1:
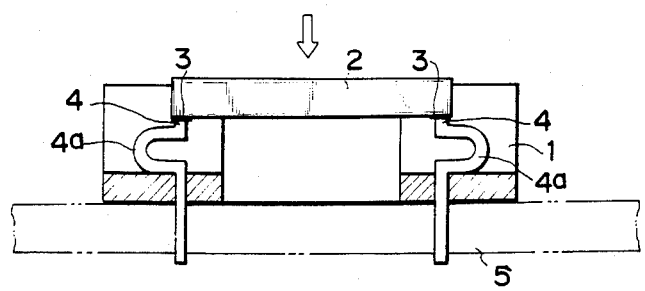
FIG. 1 is a schematic explanatory view illustrating a socket substrate having an IC package attached thereto.
Figure 2:
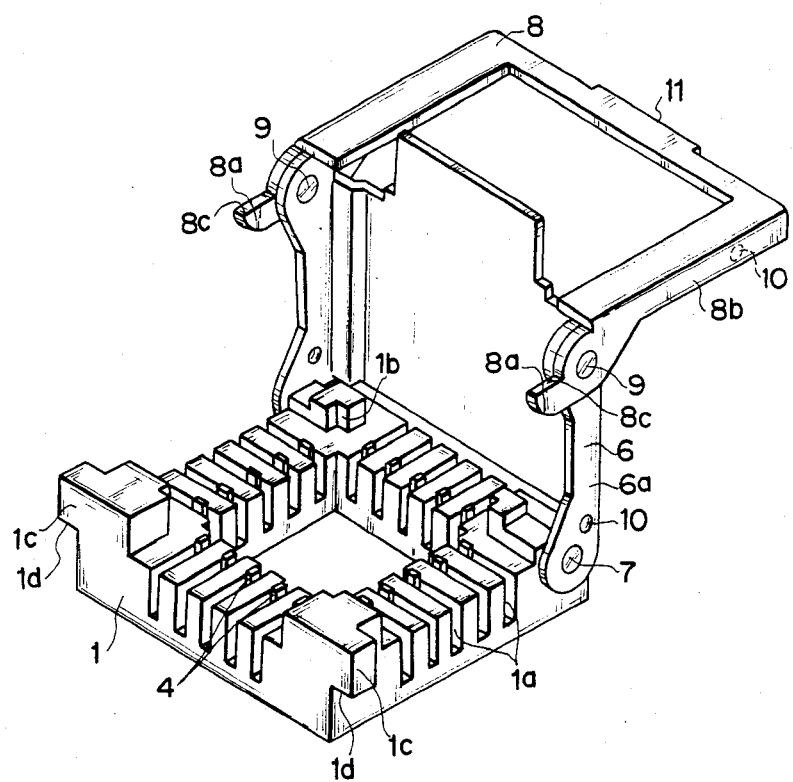
FIG. 2 is a perspective view illustrating one embodiment of the IC socket with IC package pressing means according to the present invention in a state assumed when both the pressing plate and the operative lever are allowed to rise.
Figure 3:
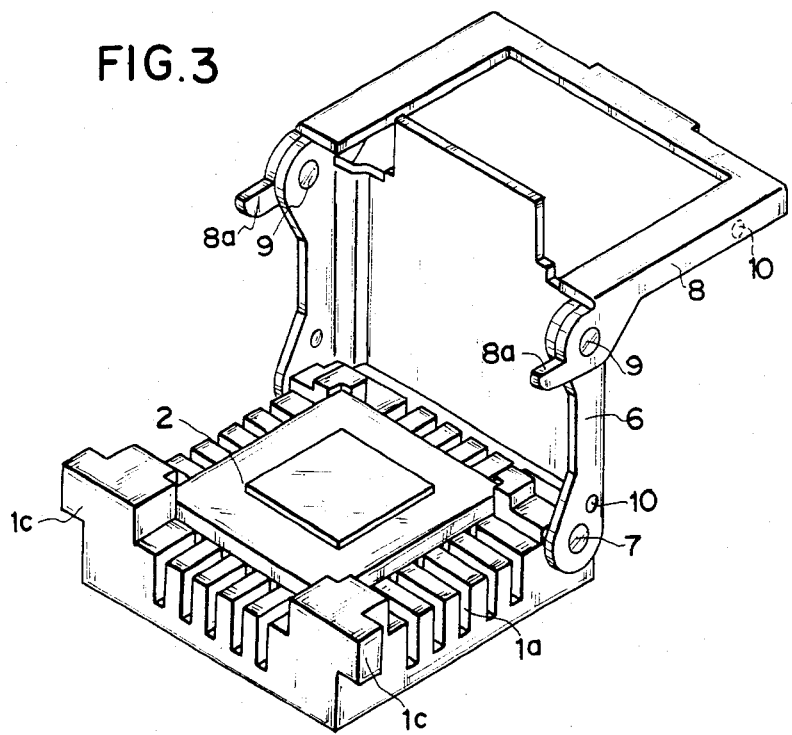
FIG. 3 is a perspective view illustrating the same embodiment in a state assumed when an IC package is attached to the attachment portion of the socket substrate.
Figure 4:
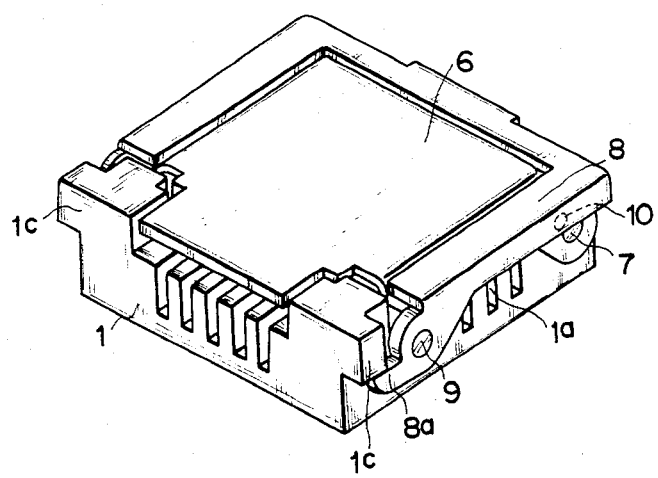
FIG. 4 is a perspective view illustrating the same embodiment in a state assumed when both the pressing plate and the operative lever are laid down.

FIG. 1 is a schematic explanatory view illustrating a socket substrate 1 having an IC package 2 attached thereto, in which terminals 3 of the IC package 2 are brought into pressing contact with contacts 4 in the socket substrate 1 by giving to the IC package downward force depicted by an arrow in the drawing. Denoted by reference numeral 4a is U-shaped flexible portions of the contacts 4, and by reference numeral 5 is a printed board.

The present invention will now be described in more detail with reference to the illustrated embodiment.

The socket substrate 1 has a plurality of ordinary contact accommodation grooves 1a formed therein for accommodating therein ordinary contacts 4 so that arrangement of the contacts 4 corresponding to that of the terminals 3 of the IC package 2 is formed in an illustrated pattern by arranging the upper ends of the contacts 4 within an entraining region (attachment portion) 1b partitioned on the upper side of the socket substrate 1 for attaching the IC package thereto, and allowing the lower ends of the contacts 4 to protrude from the rear side of the socket substrate 1.

To the opposite sides of one end of the socket substrate 1 are pivotally attached the opposite sides of one end of an IC package pressing plate 6 which is capable of rising or being laid down with pivots 7 as fulcrums and which has the opposite sides of the other end thereof pivotally attached respectively to the opposite sides of one end of an operative lever 8 so that the operative lever 8 is capable of rising or being laid down with pivots 9 as fulcrums. Thus, the socket substrate 1, pressing plate 6 and operative lever 8 are linked with the pivots 7 and 9 as fulcrums. The operative lever 8 is provided in the vicinity of the pivots 9 with a pair of engaging claw pieces 8a which are adapted to engage with flat lower surfaces 1d of receiving portions 1c formed on the socket substrate 1 so as to set laid-down positions of the pressing plate 6 and the operative lever 8 and prevent them from floating.

Figure 5A:
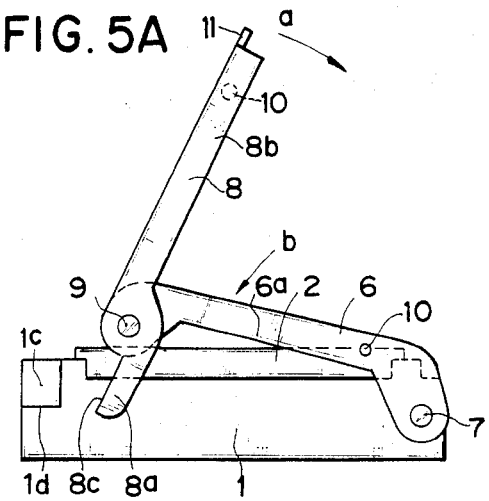
FIG. 5A through FIG. 5D are explanatory views illustrating the same embodiment in the processes from the state assumed when both the pressing plate and the operative lever are allowed to rise to the state assumed when they are laid down.
Figure 5B:
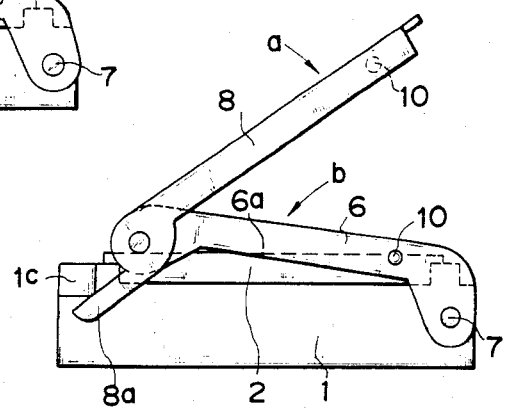
Figure 5C:
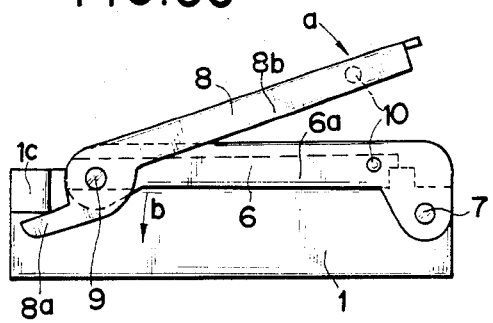
Figure 5D:
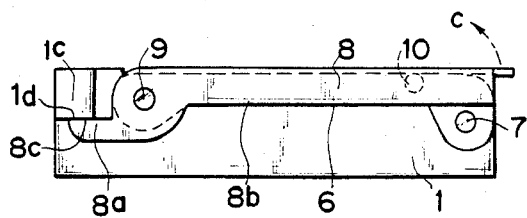

The engaging claw pieces 8a extend in a direction opposite to the extending direction of the operative lever 8 with the pivots 9 as boundaries and have their respective upper surfaces formed into flat engaging surfaces 8c. A pair of projections are formed on the opposite sides of the end of the socket substrate 1 opposite to the end pivotally attached to the pressing plate 6 with pivots 7 so as to project outwardly in the opposite directions. These projections have their respective lower surfaces formed into flat engaging surfaces 1d and function as the aforementioned receiving portions 1c. As illustrated in FIG. 5d, the flat engaging surfaces 8c of the engaging claw pieces 8a and the flat engaging surfaces 1d of the receiving portions 1c are brought to surface joint in substantially the horizontal state. At this time, the operative lever 8 and the pressing plate 6 are folded over the socket substrate 1. The pressing plate 6 has side plates 6a which project substantially at right angles from the right and left edges thereof and are positioned along the lateral sides of the socket substrate 1 when the pressing plate 6 is laid down on the socket substrate 1. It is preferable that the inner surfaces of the side plates 6a be brought into frictional engagement with the lateral sides of the socket substrate 1 when the pressing plate 6 is rotated around the pivots 7 and laid down on the socket substrate 1.

Similarly, the operative lever 8 has side plates 8b which are projected substantially at right angles from the right and left sides thereof and, when the operative lever 8 is rotated around the pivots 9 and laid down on and folded over the upper surface of the pressing plate 6, have their inner surfaces brought into frictional contact with the outer surfaces of the side plates 6a of the pressing cover.

The pressing plate 6 and the operative lever 8 are obtained by sheet metal processing, and the socket substrate 1 is molded of synthetic resin. The pressing plate 6 is a substantially rectangular plate having a size large enough to substantially cover the upper surface of the socket substrate 1 and has the plate end portions of the side plates 6a formed one each into couplings, which are brought into contact with the opposite sides of one end of the socket substrate 1 and pivotally attached thereto to form the aforementined pivots 7. The operative lever 8 is a substantially rectangular frame-shaped plate which overlaps the peripheral edge of the pressing plate 6 and has the plate end portions of the side plates 8b formed one each into couplings, which are brought into contact with the outer sides of the side plates 6a and pivotally attached thereto to form the aforementioned pivots 9.

The operation of attachment of the IC package 2 to the socket substrate 1 will be described with reference to FIG. 5A to FIG. 5D. At first, the upper surface of the socket substrate 1 is opened by rotating the pressing plate 6 around the pivots 7 and the operative lever 8 around the pivots 9 to their respective rising positions, and the IC package 2 is placed on the IC package attachment portion 1b of the socket substrate to allow the terminals 3 of the IC package 2 to be superposed on the contacts 4 of the socket substrate 1. In this state, while the operative lever 8 is rotated around the pivots 9 and laid down toward the upper surface of the pressing plate 6 (in the direction of the arrow a), as illustrated in FIG. 5A, the pressing plate 6 is rotated around the pivots 7 and laid down toward the upper surface of the socket substrate 1 (in the direction of the arrow b). In the process of laying down both the operative lever and the pressing plate, the engaging claw pieces 8a of the operative lever 8 are brought into collision with the receiving portions 1c formed on the socket substrate 1 as illustrated in FIG. 5B, and the operation of laying down the operative lever 8 and the pressing plate 6 is continued with the collision relationship retained while preventing the pressing plate 6 and the operative lever 8 from rising. As a result, both the pressing plate 6 and the operative lever 8 are laid down under the engagement of the engaging means as folded over substantially in parallel with the socket substrate 1 as illustrated in FIG. 5D. In this state, the IC package 2 is pressed down under given pressure by the pressing plate 6, and the terminals 3 of the IC package 2 come into contact under given pressure with the contacts 4 in the socket substrate 1.

In order to further retain the laid-down state of the pressing plate 6 and the operative lever 8, for example, there may be formed stopper means 10 between the side plates 6a of the pressing plate 6 and the side plates 8b of the operative lever 8. In this case, it is desirable that the stopper means 10 of the side plates 6a of the pressing plate 6 be positioned on the pivot 7 side and that the stopper means 10 of the side plates 8b of the operative lever 8 be positioned on the free end side of the operative lever 8, whereby these stopper means 10 are allowed to engage with each other when the side plates 6a and 8b overlap on the lateral sides of the socket substrate 1 in their laid-down state. For example, one of the stopper means 10 of the side plates 6a and 8b may be formed into a convex and the other into a concave so that the convex and the concave are brought into snap engagement with each other in the laid-down positions of the pressing plate 6 and the operative lever 8.

The IC package 2 is extracted from the attachment portion 1b of the socket substrate 1 by rotating the operative lever 8 around the pivots 9 in the direction of the phantom arrow c in FIG. 5D showing the laid-down positions of the pressing plate 6 and the operative lever 8, thereby allowing the pressing plate 6 and the operative lever 8 to rise with the pivots 7 as the fulcrums, and bringing the upper surface of the socket substrate 1 to its open state while gradually releasing the engagement between the engaging claw pieces 8a and the receiving portions 1c.

The operative lever 8 is provided on its free end with a pinch piece 11 adapted to be used in causing the pressing plate 6 and the operative lever 8 to rise and to be laid down. The socket substrate 1, the pressing plate 6 and the operative lever are link-connected with each other with the pressing plate 6 intervening between the socket substrate 1 and the operative lever 8. The operative lever 8 is brought to a state in which the portions thereof in the vicinity of the pivots 9 are engaged with the end portions of the socket substrate and rotated about the pivots 9 in its laid-down direction as prevented from floating by the engagement. In proportion as this rotation proceeds, downward force which is generated by the leverage of the operative lever 8 is exerted onto the pivots 9 and causes the pressing plate 6 to be rotated about the pivots 7 in its laid-down direction and folded over the upper surface of the IC package 2 while pressing the IC package 2 downwardly. As a result, the terminals 3 are brought into resilient contact under pressure with the contacts 4. The force for pressing the IC package 2 is generated by cooperation of the leverage of the pressing plate 6 and that of the operative lever 8.

Thus, the present invention can provide an IC socket with IC package pressing means, which is optimum for retaining the IC package on the upper surface of the socket substrate and guaranteeing reliable contact between the terminals and the contacts with suitable pressing force. Since it is possible to open and close the pressing plate relative to the socket substrate with ease, the IC socket of the present invention can advantageously be used in a quality inspecting test which requires repeated alternate attachment and detachment of IC packages. The opening and closing operations can easily be carried out lightly with the fingers of a single hand by utilization of the leverage of the operative lever and that of the pressing plate. Since the pressing plate is link-connected to the socket substrate with the pivots and the operative lever is also link-connected to the pressing plate with the pivots to thereby cause the pressing plate and the operative lever to rise and to be laid down, the IC package can be pressed down with slight force by the leverage of the pressing plate and that of the operative lever. Further, since the pressing plate and the operative lever can easily be raised or released relative to the IC package with single operation, the IC package can efficiently be attached to or detached from the IC socket. Therefore, labor required in a test necessitating repeated alternate attachment and detachment for inspecting the quality of IC packages can be reduced to a great extent.

What is claimed is:

1. An IC socket with IC package pressing means, which comprises:
   a socket substrate provided therein with contact accommodation grooves, on the upper surface thereof with an attachment portion for attaching an IC package thereto, and on opposite sides of one end thereof with a pair of receiving portions;
   an IC package pressing plate having one end thereof link-connected pivotally to the other end of said socket substrate with first pivots as fulcrums to be rotated about said first pivots and laid down relative to the upper surface of said socket substrate, and
   an operative lever having one end thereof link-connected pivotally to the other end of said IC package pressing plate with second pivots as fulcrums to be rotated about said second pivots and raised and laid down relative to the upper surface of said IC package pressing plate, and having a pair of engaging claw pieces disposed on the side of said second pivots to extend in a direction opposite to the other end of said operative lever and adapted to collide against and engage with the lower surfaces of said pair of receiving portions of said socket substrate,
   whereby said operative lever is rotated about said second pivots in a state wherein the upper surfaces of said pair of engaging claw pieces are brought into collision with the lower surfaces of said pair of receiving portions to be laid down on the upper surface of said IC package pressing plate, and said other end of said IC package pressing plate is given downward force by the rotation of said operative lever to allow said IC package pressing plate to be rotated about said first pivots and laid down on the upper surface of said socket substrate, and thereby said operative lever and said IC package pressing plate are laid down on the upper surface of said socket substrate as overlapping each other with said pair of engaging claw pieces brought into engagement with said pair of receiving portions to press the upper surface of said IC package attached to said attachment portion of said socket substrate.

2. The IC socket with IC package pressing means according to claim 1, wherein said IC package pressing plate is provided with engaging means which are brought into frictional engagement with the lateral sides of said socket substrate when being laid down on the upper surface of said socket substrate, and said operative lever is provided with engaging means which are brought into frictional engagement with said engaging means of said IC package pressing plate when being laid down on the upper surface of said IC package pressing plate, whereby said IC package pressing plate and said operative lever are pevented from rising.

3. The IC socket with IC package pressing means according to claim 1, further comprising a convex formed on one of said IC package pressing plate and said operative lever, and a concave formed in the other of said IC package pressing plate and said operative lever, said convex and said concave being brought into snap engagement with each other when said operative lever is laid down on the upper surface of said IC package pressing plate, thereby preventing said IC package pressing plate and said operative lever from rising.

4. The IC socket with IC package pressing means according to claim 1, wherein the upper surfaces of said pair of engaging claw pieces are flat engaging surfaces and the lower surfaces of said pair of receiving portions are flat engaging surfaces, and said flat engaging surfaces of said pair of engaging claw pieces and said pair of receiving portions being brought to surface joint in a substantially horizontal state when said IC package pressing plate and said operative lever overlap each other on the upper surface of said socket substrate.

* * * * *